United States Patent
Tsuji

(10) Patent No.: US 6,285,855 B1
(45) Date of Patent: Sep. 4, 2001

(54) ILLUMINATION SYSTEM AND EXPOSURE APPARATUS HAVING THE SAME

(75) Inventor: Toshihiko Tsuji, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/044,148

(22) Filed: Mar. 19, 1998

(30) Foreign Application Priority Data

Mar. 24, 1997 (JP) .................................................... 9-069671

(51) Int. Cl.⁷ .................................................. G02B 27/10
(52) U.S. Cl. ........................... 399/618; 359/619; 359/620
(58) Field of Search ................................. 359/618, 619, 359/620; 362/268, 269

(56) References Cited

U.S. PATENT DOCUMENTS

| | | | |
|---|---|---|---|
| 4,918,583 | 4/1990 | Kudo et al. | 362/268 |
| 5,153,773 | * 10/1992 | Muraki | 359/619 |
| 5,305,054 | 4/1994 | Suzuki et al. | 355/53 |
| 5,463,497 | 10/1995 | Muraki et al. | 359/618 |
| 5,675,401 | 10/1997 | Wangler et al. | |

FOREIGN PATENT DOCUMENTS

| | | |
|---|---|---|
| 0 687 956 | 12/1995 | (EP) . |
| 64-913 | 1/1989 | (JP) . |
| 1-271718 | 10/1989 | (JP) . |
| 1-295215 | 11/1989 | (JP) . |
| 2-48627 | 2/1990 | (JP) . |
| 3-215930 | 9/1991 | (JP) . |
| 4-225214 | 8/1992 | (JP) . |
| 4-329623 | 11/1992 | (JP) . |
| 5-217855 | 8/1993 | (JP) . |

* cited by examiner

Primary Examiner—Georgia Epps
Assistant Examiner—Michael A Lucas
(74) Attorney, Agent, or Firm—Fitzpatrick, Cella, Harper & Scinto

(57) ABSTRACT

An illumination system includes a first optical integrator of inside reflection type, for reflecting at least a portion of received light, with its inside surface, and for defining a surface light source at or adjacent a light exit surface thereof, a second optical integrator of wavefront division type, for dividing the wavefront of received light and for defining a plurality of light sources at or adjacent a light exit surface thereof, an imaging optical system for imaging the surface light source at or adjacent a light entrance surface of the second optical integrator, and a collecting optical system for superposing light rays from the plurality of light sources one upon another, on a surface to be illuminated, wherein the imaging optical system has a variable imaging magnification.

22 Claims, 13 Drawing Sheets

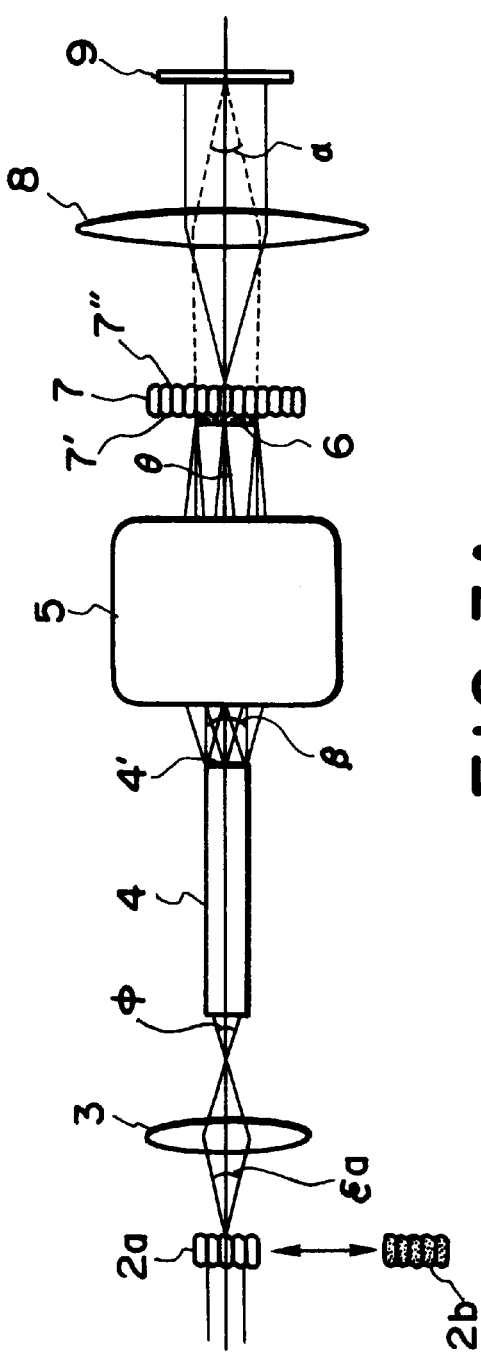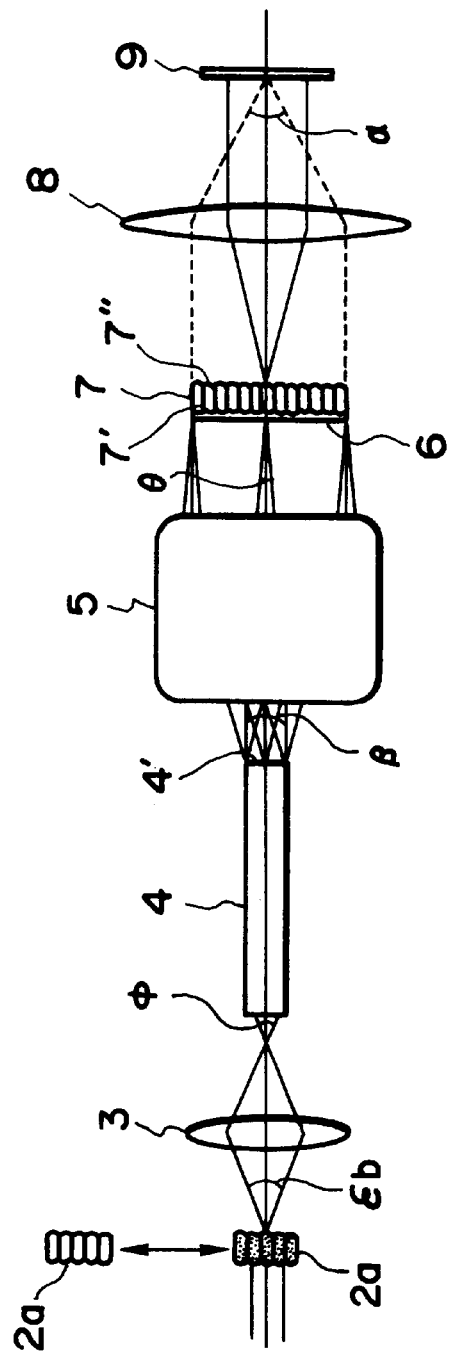
FIG. 3A
FIG. 3B

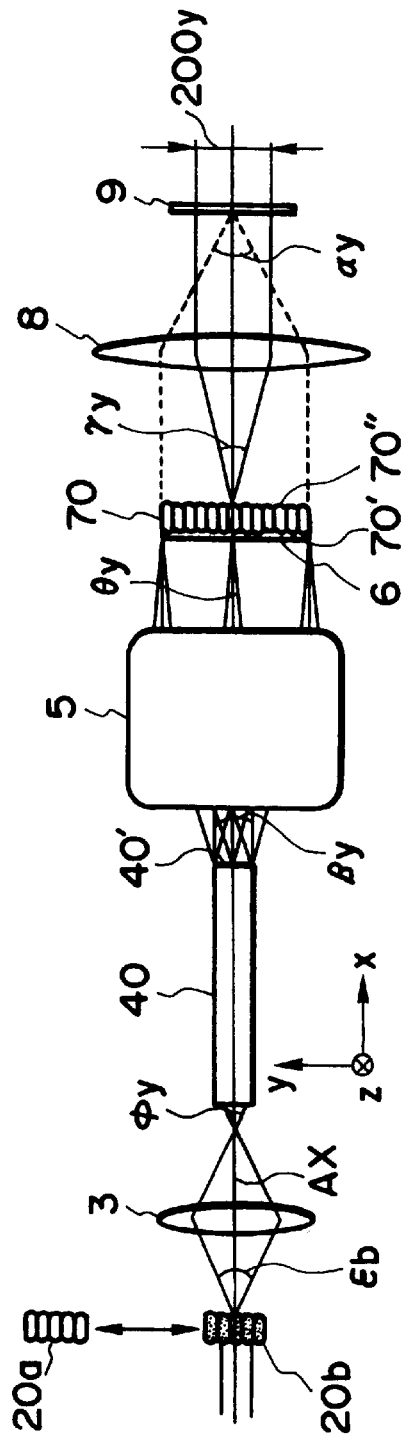
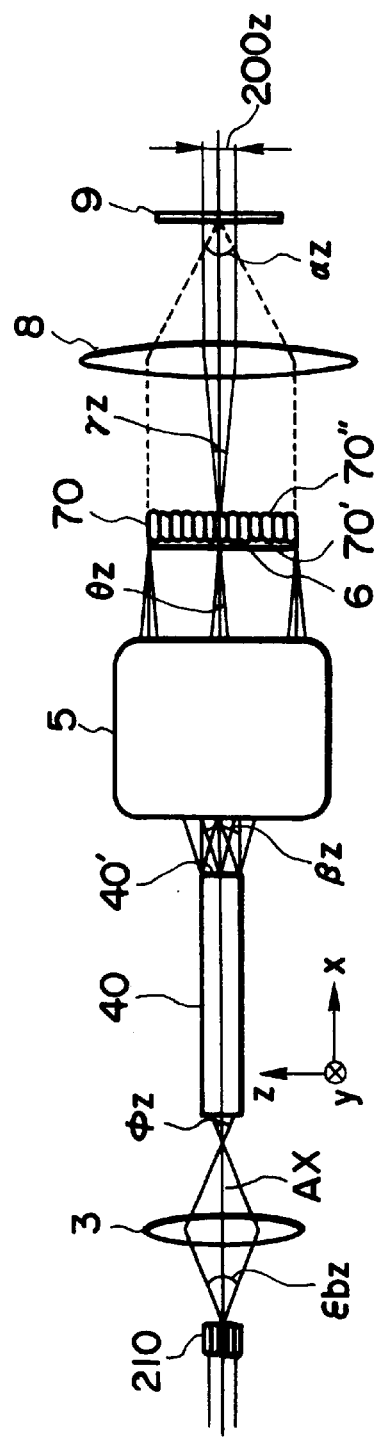
FIG. 8A
FIG. 8B

ILLUMINATION SYSTEM AND EXPOSURE APPARATUS HAVING THE SAME

FIELD OF THE INVENTION AND RELATED ART

This invention relates to an illumination system, an exposure apparatus and a device manufacturing method. More particularly, the invention is concerned with an illumination system, an exposure apparatus and a device manufacturing method, wherein an excimer laser for emitting light in the ultraviolet region is used as a light source, for illuminating uniformly the surface of a wafer or the surface of a reticle where a fine pattern such as an electronic circuit pattern is formed.

In a semiconductor chip manufacturing process, fine patterns formed on different masks are sequentially transferred to and superposed on the surface of a wafer. To this end, an illumination system of an exposure apparatus illuminates a mask or reticle placed at a position optically conjugate with the surface of a wafer, whereby a pattern of the mask is projected and transferred onto the wafer surface through a projection lens.

The quality of an image transferred to the wafer is largely influenced by the performance of the illumination system, e.g., the uniformness of the illuminance distribution upon the mask surface or wafer surface.

Japanese Laid-Open Patent Application, Laid-Open No. 913/1989, No. 295215/1989, No. 271718/1989, or No. 48627/1990 proposes an illumination system wherein the uniformness of the illuminance distribution is improved by the use of an inside reflection type integrator and a wavefront division type integrator.

FIG. 13 is a schematic view of a portion of an illumination system which uses an inside reflection type integrator and a wavefront division type integrator.

In FIG. 13, the laser beam emitted by a laser light source 101 is once converged by a lens system 107 at a position close to the light entrance surface of an optical pipe (inside reflection type integrator) 110, and then it is diverged such that it enters the optical pipe 110 with a predetermined divergence angle defined with respect to the inside reflection surface of the optical pipe 110.

The laser beam divergently incident on the optical pipe is propagated within the optical pipe 110 while being reflected by the inside surface thereof. Thus, the optical pipe 110 functions to form a plurality of virtual images, related to the laser light source 101, on a plane (e.g., plane 113) which is perpendicular to the optical axis.

On the light exit surface 110' of the optical pipe 110, plural laser light fluxes which appear as coming from the virtual images, that is, as emitted from plural apparent or seeming light sources, are superposed one upon another. As a result of this, a surface light source having a uniform light intensity distribution is defined on the light exit surface 110' of the optical pipe 110.

By means of a condenser lens 105, an aperture stop 111 and a field lens 112, the light exit surface 110' of the optical pipe 110 and a light entrance surface 106 of a fly's eye lens (wavefront division type integrator) are placed in an optically conjugate relation with each other. Thus, the surface light source with a uniform intensity distribution at the light exit surface 110' is imaged on the light entrance surface 106 of the fly's eye lens. As a result, such light as having a uniform sectional intensity distribution enters the fly's eye lens. The fly's eye lens serves to define plural light sources (secondary light sources) at its light exit surface. Light beams from these secondary light sources are superposed by a condenser lens (not shown) one upon another, on the surface of a reticle, not shown. Thus, the pattern of the reticle as a whole is illuminated with a uniform intensity.

The illumination system of FIG. 13 is provided with an aperture stop, disposed just after the fly's eye lens and having a fixed shape and a fixed diameter. Thus, the numerical aperture of the illumination system (the size of the secondary light source) is fixed and, therefore, the state of illumination is unchangeable with the size of the smallest pattern of the reticle.

Further, in the illumination system of FIG. 13, if the laser light source 101 comprises such a light source (as a certain type excimer laser) wherein the path of laser beam LB shifts in a direction perpendicular to the optical axis AX, a minute change of the optical path may cause a change in intensity distribution of light fluxes LF, impinging on respective points 106 on the light entrance surface of the fly's eye lens. This results in a change in the illuminance distribution upon the reticle.

SUMMARY OF THE INVENTION

It is a first object of the present invention to provide an illumination system with an inside reflection type integrator and a wavefront division type integrator, wherein the state of illumination is changeable.

An illumination system according to this aspect may include a variable-magnification imaging optical system disposed just before a wavefront division type integrator. However, if the imaging magnification changes, the open angle NA of the light flux LF changes. Particularly, when the magnification decreases, the open NA of the light flux may become larger, excessively beyond the range allowed by the lenses of the fly's eye lens. On that occasion, a portion of the light entering the lens element is eclipsed within the lens element, such that some light does not emit toward the required range (direction). This causes a reduction of the light quantity for illuminating the reticle.

It is accordingly a second object of the present invention to provide an illumination system with a wavefront division type integrator, wherein even in such a case (regardless of whether the system is equipped with an inside reflection type integrator or not) a decrease in the quantity of light illuminating a mask or reticle is substantially prevented.

It is a third object of the present invention to provide an illumination system with an inside reflection type integrator and a wavefront division type integrator, wherein the illuminance distribution upon the surface being illuminated is unchanged even if the path of light from a light source shifts.

In accordance with an aspect of the present invention, to achieve the first object, there is provided an illumination system, comprising: a first optical integrator of an inside reflection type, for reflecting at least a portion of received light, with its inside surface, and for defining a surface light source at or adjacent to a light exit surface thereof; a second optical integrator of a wavefront division type, for dividing the wavefront of received light and for defining a plurality of light sources at or adjacent to a light exit surface thereof; an imaging optical system for imaging the surface light source at or adjacent to a light entrance surface of said second optical integrator; and a collecting optical system for superposing light rays from said plurality of light sources one upon another, on a surface to be illuminated; wherein said imaging optical system has a variable imaging magnification.

In accordance with another aspect of the present invention, to achieve the second object, there is provided an illumination system, comprising: a wavefront division type optical integrator for dividing the wavefront of received light and for defining a plurality of light sources at or adjacent to a light exit surface thereof; a light projecting optical system for projecting light from a light source to a light entrance surface of said optical integrator, and a collecting optical system for superposing light rays from said plurality of light sources one upon another, on a surface to be illuminated; wherein said light projecting optical system has a focal length which is changeable to cause a change of at least one of the size and the intensity distribution of the light, from the light source, upon the light entrance surface of said optical integrator; and wherein said light projection optical system serves to correct a change in an open angle of light, impinging on said wavefront division type optical integrator, due to the change in focal length.

In accordance with a further aspect of the present invention, to achieve the second object, there is provided an illumination system, comprising: a first optical integrator of a wavefront division type, for dividing the wavefront of received light and for defining a plurality of light sources at or adjacent to a light exit surface thereof; a second optical integrator of an inside reflection type, for reflecting at least a portion of received light, with its inside surface, and for defining a surface light source having a uniform intensity distribution, at or adjacent to a light exit surface thereof; a third optical integrator of a wavefront division type, for dividing the wavefront of received light and for defining a plurality of light sources at or adjacent to a light exit surface thereof; a first imaging optical system for imaging the light sources as defined by said first optical integrator, on or adjacent to a light entrance surface of said second optical integrator; a second imaging optical system for imaging the surface light source as defined by said second optical integrator, on or adjacent to a light entrance surface of said third optical integrator; and a collecting optical system for superposing light rays from the light sources as defined by said third optical integrator, one upon another on a surface to be illuminated.

In accordance with the present invention, there may be provided an exposure apparatus or a device manufacturing method which is based on an illumination system such as described above. The exposure apparatus may be a step-and-repeat type reduction projection exposure apparatus or a step-and-scan type projection exposure apparatus, having a resolution higher than 0.5 micron. A device which can be produced with such an exposure apparatus may be a semiconductor chip such as an LSI or a VLSI, a CCD, a magnetic sensor or a liquid crystal device.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3A and 3B are schematic views, respectively, for explaining switching of the emission angle keeping element.

FIGS. 8A and 8B are schematic views, respectively, of the second embodiment of an illumination system according to the present invention, with the structure arranged for a large σ state.

DESCRIPTION OF THE PREFERRED EMBODIMENTS

Figure 1:
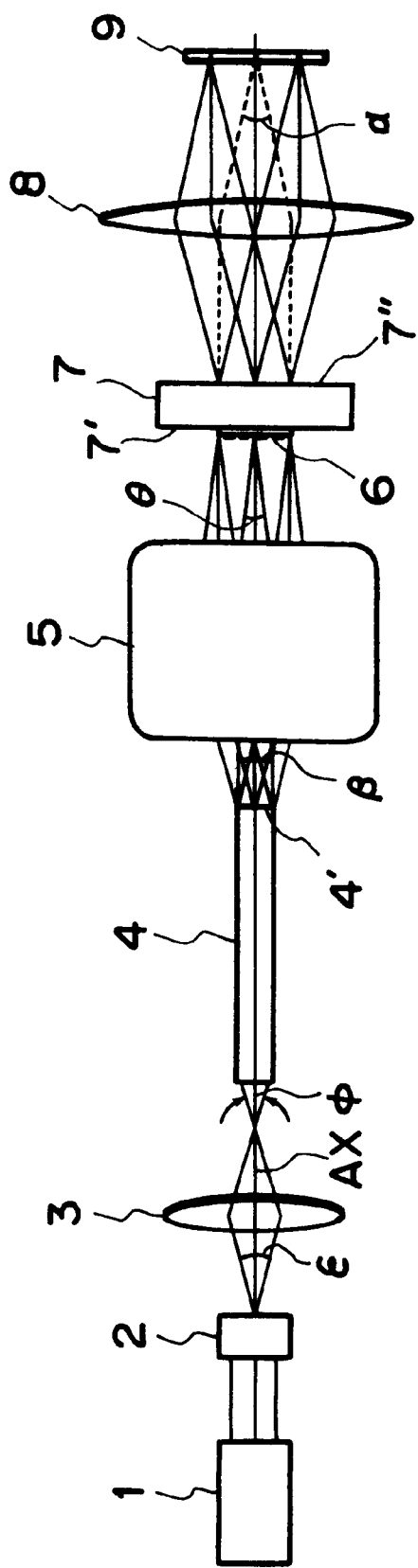
FIG. 1 is a schematic view of a first embodiment of an illumination system, according to the present invention.

FIG. 1 is a schematic view of a first embodiment of the present invention, which is applied to an illumination system for use in a step-and-repeat type or step-and-scan type projection exposure apparatus for manufacturing devices such as semiconductor chips (e.g., LSI or VLSI), CCDS, magnetic sensors and liquid crystal devices, for example.

Denoted in FIG. 1 at 1 is a laser light source such as an ArF excimer laser (wavelength: about 193 nm) or a KrF excimer laser (wavelength: about 248 nm), for example. Denoted at 2 is an emission angle keeping optical element having such a function that the emission angle (divergence angle or convergence angle) of light to be emitted is unchanged (maintained) regardless of a change in incidence light. Denoted at 3 is a condensing or collecting optical system, and denoted at 4 is light mixing means. Denoted at 5 is a zooming optical system, and denoted at 7 is a multi-flux light beam producing means. Denoted at 8 is another condensing optical system, and denoted at 9 is an object to be illuminated, such as a mask or reticle on which a device pattern is formed. Denoted at AX is an optical axis of the illumination system.

Basically, the condensing optical system 8 and the zooming optical system comprise a plurality of lens elements. In some cases, they have at least one mirror for deflecting the light path. There may be a case wherein these optical components include a single lens element, respectively.

A predetermined lens element or elements of the zooming optical system 5 are made movable along the optical axis AX, by means of a driving mechanism (not shown). By moving the lens elements in a predetermined relationship, along the optical axis direction, the focal length is changed and thus the imaging magnification is changed, with the position of the imaging plane held fixed.

The light mixing means 4 comprises a single optical pipe or a bundle of plural optical pipes. The optical pipe may comprise a solid glass rod of a polygonal prism shape or a polygonal pyramid shape with its top cut off, and it may be made of a glass material (quartz or fluorite, for example) having good transmissivity to the laser beam from the laser light source 1. Alternatively, the optical pipe may comprise a hollow optical element such as a kaleidoscope, as can be provided by three or more flat mirrors disposed into a cylindrical shape, with their reflection surfaces opposed. Such a hollow optical element may have an outside shape of a polygonal prism or polygonal pyramid with its top cut off.

The reflection surface at the side face of the optical pipe (i.e., the interface with the air in the case of a glass rod, and the inside reflection surface in the case of a hollow optical element) is flat and it has a high reflection factor. The light mixing means 4 functions as follows: it propagates the received light while at least a portion of the received light is reflected by the reflection surface at its side face, and light rays of the received light are mixed with each other, whereby a surface light source (light) with a uniform intensity distribution is formed at or adjacent the the light exit surface 4' thereof. In this specification, the light mixing means 4 or an element having the same function as the light mixing means 4 will be referred to as an "inside reflection type integrator".

Multi-flux light producing means 7 comprises a fly's eye lens having a number of small lenses, a lenticular lens, or a bundle of optical fibers, for example. It functions to divide the wavefront of received light, incident on its light entrance surface 7', into plural portions and to form a surface light source (light) consisting of plural point light sources, at or adjacent to the light exit surface 7" thereof. The light rays from these plural point light sources are superposed one upon another by means of the condensing optical system 8, whereby a surface light source (light) with a uniform intensity distribution is produced on a predetermined plane. In this specification, the multi-flux light producing means 7 or an element having the same function as the multi-flux light producing means will be referred to as a "wavefront division type integrator".

Figure 2A:
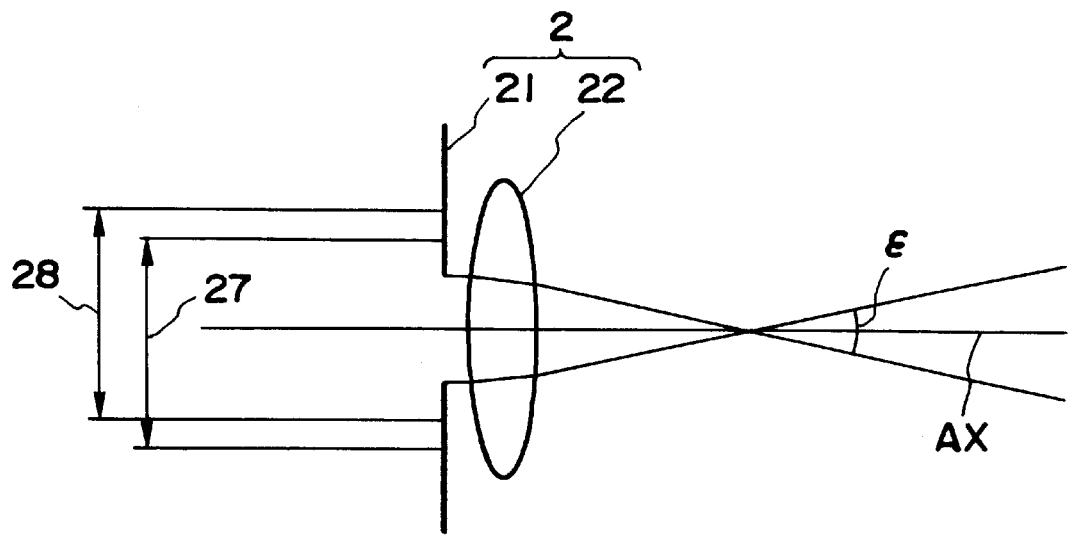
FIGS. 2A and 2B are schematic views, respectively, showing two examples of an emission angle keeping optical element, respectively.

The laser light emitted by the laser light source 1 goes by way of a light directing optical system which comprises a mirror or relay lens (not shown), and it enters the emission angle keeping optical element 2. As best seen in FIG. 2A, the emission angle keeping optical element 2 comprises an aperture member 21 and a lens system 22. The emission angle keeping optical element 2 has a function that, even if the projected light shifts within a certain range, in a direction perpendicular to or substantially perpendicular to the optical axis AX, that is, if it changes from the state as depicted by light 27 (FIG. 2A) to the state as depicted by light 28, the emission angle (open angle) $\epsilon$ of the light emitted by the emission angle keeping optical element 2 is maintained constant.

Figure 2B:
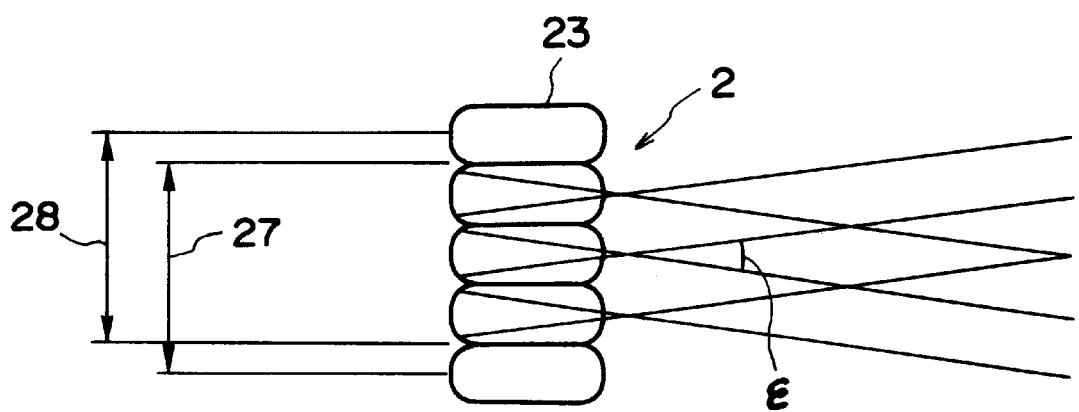

The emission angle keeping optical element 2 may be provided by a fly's eye lens structure, as shown in FIG. 2B, which comprises a plurality of small lenses 23. On that occasion, the emission angle $\epsilon$ depends on the shape of the small lens. Also, in the case of the optical element 2 shown in FIG. 2B, even if the projected light shifts within a certain range, in a direction perpendicular to the optical axis AX such that it changes from the state as depicted by light 27 to the state as depicted by light 28, the emission angle (open angle) $\epsilon$ of the light emitted from the emission angle keeping optical element 2 is maintained constant. It is to be noted that a wavefront division type integrator other than a fly's eye lens may also be used as the emission angle keeping optical element 2.

The light emitted with an emission angle $\epsilon$ from the emission angle keeping optical element 2 (it comprises multi-flux light when a fly's eye lens is used), is once converged by the condensing optical system 3 at a position before the inside reflection type integrator. Then, it enters the inside reflection type integrator 4, in a divergent state. The divergent light beam incident on the inside reflection type integrator 4 passes therethrough while being multi-reflected by the inside reflection surface thereof, and a plurality of virtual images of the laser light source 1 (apparent or seeming light source images) are defined on a plane perpendicular to the optical axis AX. Thus, at the light exit surface 4' of the inside reflection type integrator 4, plural light beams seemingly having been emitted from these Virtual images are superposed upon one another and, as a result, a uniform intensity distribution is produced at the light exit surface 4'. This phenomenon will be described later in detail, with reference to FIG. 4.

The shape of the inside reflection type integrator 4 may be determined while taking into account (i) the divergence angle of laser light, as it enters the inside reflection type integrator 4 (the angle being dependent upon the emission angle keeping optical element 2 and the condensing optical system 3), and (ii) the length and width (diameter) of the inside reflection type integrator 4. Then, the optical path difference of individual laser light coming from the virtual images and impinging on the object 9, to be illuminated, can be made longer than the coherency length peculiar to the laser light. Thus, coherency of laser light with respect to time can be made lower, and production of speckle upon the object 9 illuminated can be reduced.

Referring back to FIG. 1, the surface light source (light) formed at the light exit surface 4' of the inside reflection type integrator 4 and having a uniform illuminance distribution (light intensity distribution), is enlarged and imaged by the zooming optical system 5 upon the light entrance surface 7' of the wavefront division type integrator 7, at a desired magnification. By this, a uniform light source image 6 is defined on the light entrance surface 7'.

When uniform light source image 6 is formed on the light entrance surface 7', the light intensity distribution on the light entrance surface 7' is directly transferred to the light exit surface 7" of the wavefront division type integrator 7. Thus, at or adjacent to the light exit surface 7", a surface light source comprising a number of point light sources of substantially the same intensity and having a uniform intensity distribution is produced.

With the function of the condensing optical system 8, the light fluxes emitted from the large number of point light sources at or adjacent to the light exit surface 7" illuminate the object 9 while being superposed one upon another. Therefore, the illuminance distribution over the object 9 as a whole becomes uniform.

The words "desired magnification" mentioned above correspond to the magnification with which the size of the uniform light source 6 is so determined as to set the open angle $\alpha$ (emission angle) of illumination light impinging on the object 9 to a value best suited for the exposure. When the object is a mask or reticle having a fine pattern thereon, the "desired magnification" may be modified in accordance with the type of the mask pattern (i.e., the size of the smallest pattern linewidth).

When the "desired magnification" is denoted by m and if the light entrance side numerical aperture of the zooming optical system 5, which depends on the open angle β (emission angle) of light emitted from the inside reflection type integrator 4, is denoted by NA' while the light exit side numerical aperture of the zooming optical system 5, which depends on the open angle θ (emission angle) of light incident on the wavefront division type integrator 7, is denoted by NA", then a relation NA'=m·NA" is satisfied. Here, from the standpoint of efficient use of the illumination light, the magnitude of the angle θ should desirably be within a range not exceeding the light entrance side numerical aperture NA of the wavefront division type integrator 7 and also it should desirably be as close as possible to this numerical aperture NA.

Thus, in the illumination system of this embodiment, the value of angle θ is set constantly to be kept at an optimum angle suited for the entrance side numerical aperture of the wavefront division type integrator 7, regardless of changes in the value of the magnification m.

Namely, if the exposure condition such as the type of mask changes and thus the value of the optimum magnification m of the zooming optical system 5 should be changed to an extent that cannot be disregarded, the value of the open angle β of light to be emitted from the inside reflection type integrator 4 is also changed to prevent a decrease of utilization efficiency of the illumination light.

Once an optimum magnification m for an exposure process under a certain condition is determined, an optimum angle for the open angle β (emission angle β) of light emitted from the inside reflection type integrator 4 can be appropriately determined, on the basis of equation (1).

The illumination system of this embodiment is based on that: the value of angle β is equal to the incidence angle φ of light impinging on the inside reflection type integrator 4 and also the incidence angle φ is dependent upon the open angle (emission angle) ε of light from the emission angle keeping optical element 2. Thus, in accordance with the exposure condition, the emission angle keeping optical element 2 is changed by another having a different emission angle ε and, by this, the value of angle θ can be maintained constant or substantially constant. As a result of this, the entrance side numerical aperture of the wavefront division type integrator is maintained substantially constant.

Switching the emission angle keeping optical element 2 will be described in detail, with reference to FIGS. 3A and 3B.

In FIGS. 3A and 3B, denoted at 2a is an emission angle keeping optical element having a smaller emission angle ε (=εa), and denoted at 2b is another emission angle keeping optical element having a larger emission angle ε (=εb). The remaining reference numerals like those of FIG. 1 are assigned to corresponding elements.

Generally, in an illumination system of a semiconductor chip manufacturing projection exposure apparatus, it is required that the open angle (incidence angle) α of light incident on the pattern bearing surface of a mark or reticle (which corresponds to the object 9 to be illuminated) is set to an optimum angle and also that a high light utilization efficiency (light quantity) is maintained for the projected light. In consideration of this, in the illumination system of this embodiment, a zooming optical system and a plurality of emission angle keeping optical elements 2 are prepared, and zooming and optical elements are switched as required, such as in response to a change in the type of the mask used, for example.

FIG. 3A illustrates a case wherein the incidence angle α of light incident on the mask 9 is relatively small (this is called a "smaller σ state"). It corresponds to a case wherein the smallest linewidth of a circuit pattern of the mask 9 is relatively large, although it is within the range of submicrons. Here, σ means the ratio between the light exit side numerical aperture Ni of the illumination optical system and the light entrance side numerical aperture Np of the projection optical system, that is, it corresponds to the ratio Ni/Np.

In order to accomplish the state for smaller σ, the light exit surface 4' of the inside reflection type integrator 4 (or the surface light source at or adjacent to it) should be imaged, at a small magnification, upon the light entrance surface 7' of the wavefront division type integrator 7. While this can be accomplished by making the magnification of the zooming optical system 5 smaller, as described above, the incidence angle θ has to be maintained at an optimum angle which is dependent upon the structure of the wavefront division type integrator 4. Thus, when the system is to be changed into the smaller σ state, the magnification of the zooming optical system is changed to one corresponding to the value of the incidence angle α and, additionally, in order to assure that the incidence angle θ is kept at an optimum value, the emission angle keeping optical element 2b having an emission angle εb (>εa) is replaced by the emission angle keeping optical element 2a having an emission angle εa.

FIG. 3B shows a case wherein the incidence angle α of light incident on the mask 9 is relatively large (this is called a "larger σ state"). It corresponds to a case wherein the minimum linewidth of the circuit pattern of the mask 9 is relatively small, within the range of submicrons. In order to provide the state for a larger σ, the light exit surface 4' of the inside reflection type integrator 4 (or the surface light source at or adjacent to it) should be imaged, at a large magnification, upon the light entrance surface 7' of the wavefront division type integrator 7. While this can be accomplished by making the magnification of the zooming optical system 5 larger, as described above, the incidence angle θ has to be maintained at an optimum angle which is dependent upon the structure of the wavefront division type integrator 4. Thus, when the system is to be changed into the larger σ state, the magnification of the zooming optical system is changed to one corresponding to the value of incidence angle α and, additionally, in order to assure that the incidence angle θ is kept at an optimum value, the emission angle keeping optical element 2a having an emission angle εa (<εb) is replaced by the emission angle keeping optical element 2b having an emission angle εb.

Although in the above-described example the imaging magnification of the zooming optical system and the emission angle keeping optical elements are switched or changed by two steps, the structure may be modified so that the imaging magnification of the zooming optical system and the emission angle keeping optical elements are changed by three steps or more. Since the magnification of the zooming optical system can be changed continuously within a predetermined range, changing the magnification by three steps or more is easy. Thus, it can be used without modification. Further, as regards the emission angle keeping optical elements, three or more emission angle keeping optical elements having mutually different focal lengths may be prepared. It is to be noted here that the structure is such that, independently from an interchange of the emission angle keeping optical elements, the position of convergence of laser light (in this embodiment, it corresponds to the absolute position of a real image or virtual image of the light emitting portion which is at infinity) is maintained constant.

As regards the zooming optical system, different types of imaging optical systems having different imaging magnifications (focal lengths) may be prepared, and one of them may be selectively disposed between the two integrators 4 and 7. On the other hand, as regards the emission angle keeping elements, a zooming optical system having lens elements movable along the optical axis direction may be used.

Next, how the illuminance distribution upon the light exit surface 4' of the inside reflection type integrator 4 is made uniform, will be explained with reference to FIG. 4.

Figure 4:
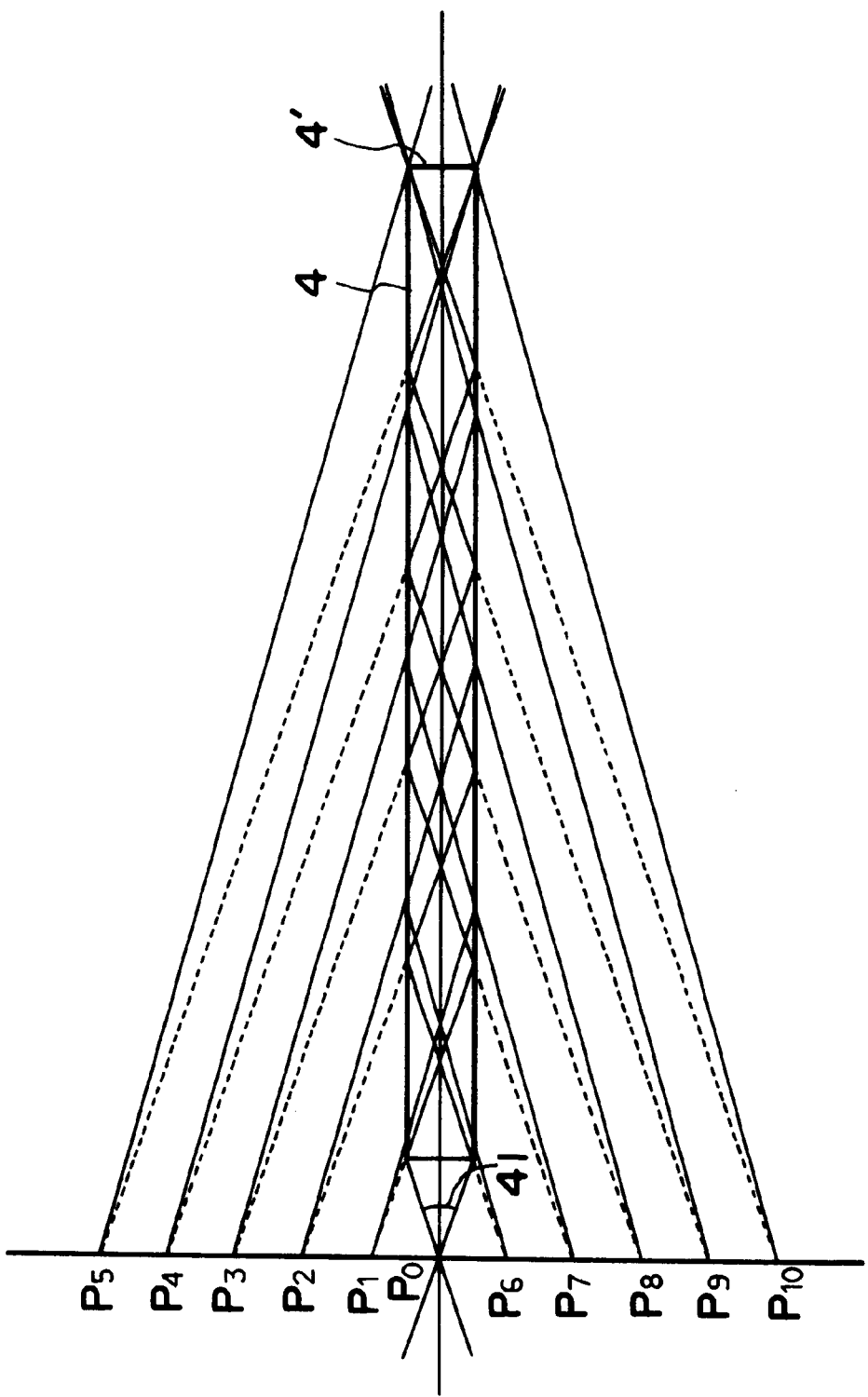
FIG. 4 is a schematic view for explaining the function of an inside reflection type integrator.

It is assumed that in the example of FIG. 4, the inside reflection type integrator 4 comprises a glass rod of a hexagonal prism shape. FIG. 4 is a side sectional view, containing the optical axis AX.

Laser light from the condensing optical system 3, not shown in this drawing, is once converged (imaged) at a focal point $P_0$. From there, it advances as divergent light having a divergence angle $\phi$. Here, if the laser light comprises excimer laser light, since the intensity is generally high, an enormous energy density is produced in the neighborhood of the focal point $P_0$. There is a possibility that it damages or breaks the coating material (anti-reflection film) on the light entrance surface of the inside reflection type integrator 4 or the glass material itself of the integrator 4. In such a case, therefore, the inside reflection type integrator 4 is disposed at a small distance from the focal point $P_0$, as illustrated.

The divergent light impinging on the inside reflection type integrator 4 passes therethrough while being repeatedly reflected (it may be subjected to total reflection) by the inside reflection surface. After this, the light goes out of the inside reflection type integrator 4 while maintaining the same divergence angle 41 as having been incident. Here, since the light beam having been reflected at respective portions of the inside reflection surface of the inside reflection type integrator 4 is still divergent after being reflected, the light fluxes reflected by respective portions define virtual images $P_1$, $P_2$, $P_3$, $P_4$, $P_5$, $P_6$, $P_7$, $P_8$, $P_9$ and $P_{10}$ behind it, as depicted by broken lines. Although not shown in the drawing, in the case of a hexagonal prism glass rod, actually there are similar virtual image groups defined additionally by the function of the remaining two pairs of inside reflection surfaces.

Thus, at the light exit surface 4' of the inside reflection type integrator 4, a large number of light fluxes which seemingly appear as having been emitted from a large number of virtual images are superposed one upon another, by which the illuminance distribution is made uniform.

Figure 5:
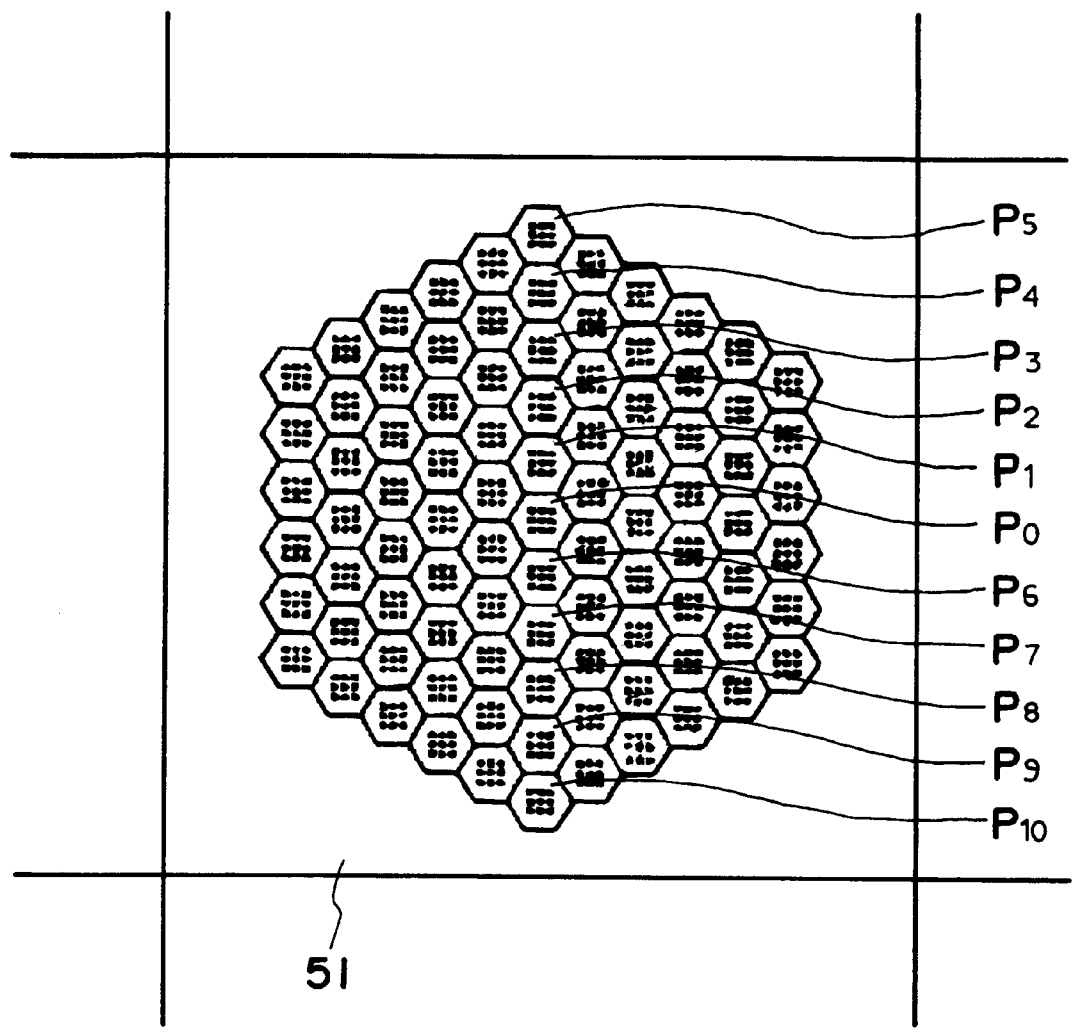
FIG. 5 is a schematic view for explaining virtual image groups as defined by the inside reflection type integrator 4 of the examples of FIGS. 1–4.

FIG. 5 shows an array of virtual image groups (seeming light source image groups) as produced by the inside reflection type integrator of FIG. 4, as viewed from, in the arrangement of FIG. 3A, for example, the light exit surface of one small lens which constitutes the wavefront division type integrator 7. In FIG. 5, denoted at 51 is a small lens of the wavefront division type integrator 7, and denoted at $P_1$–$P_{10}$ are virtual images of FIG. 4. As seen from FIG. 5, when the inside reflection type integrator 4 comprises an optical pipe of a hexagonal prism shape, the groups of virtual images have a honeycomb-like array. When, on the other hand, the inside reflection type integrator comprises an optical pipe of a rectangular prism shape, the groups of virtual images have a rectangular grid-like array. These virtual images are images of convergent points (point light sources) of laser light as formed between the condensing optical system 3 and the inside reflection type integrator 4.

Each of the emission angle keeping optical elements 2a and 2b of the illumination system of this embodiment comprises a fly's eye lens having small lenses of a number "m×n" (m≧2 and n≧2). Thus, an individual virtual image in the virtual image groups is provided by plural images, being divided into a number about "m×n". Therefore, virtual images as provided by a honeycomb array of these divided images are seen, and they correspond to a single small lens of the wavefront division type integrator 7.

Thus, in the illumination system of this embodiment, when the light fluxes from the plural point light sources (effective light sources) as formed at or adjacent to the light exit surface 7" of the wavefront division type integrator 7 are superposed one upon another by the condensing optical system 7 to illuminate the object 9, the number of such point light sources (effective light sources) is made quite large. This enables, for illumination of the object 9, provision of a more uniform illuminance distribution over the whole object 9.

Further, as has been described with reference to FIG. 2B, even if the light from the laser light source 1 shifts minutely due to external disturbance, the emission angle $\epsilon$ of light from the emission angle keeping optical element 2a or 2b can be maintained constant. Only each of the divided images shown in FIG. 5 shifts minutely, and there is no change in the virtual image groups constituting the honeycomb array. Thus, when the whole virtual images within the small lenses 51 of the wavefront division type integrator 7 are viewed macroscopically, there is substantially no change. Therefore, the effect upon the illuminance distribution on the object 9 being illuminated is very small and it can be disregarded.

In summary, the illumination system of this embodiment can be said to be a system with a constantly stable performance, independently of a shift of laser light from the laser light source 1.

Figure 6:
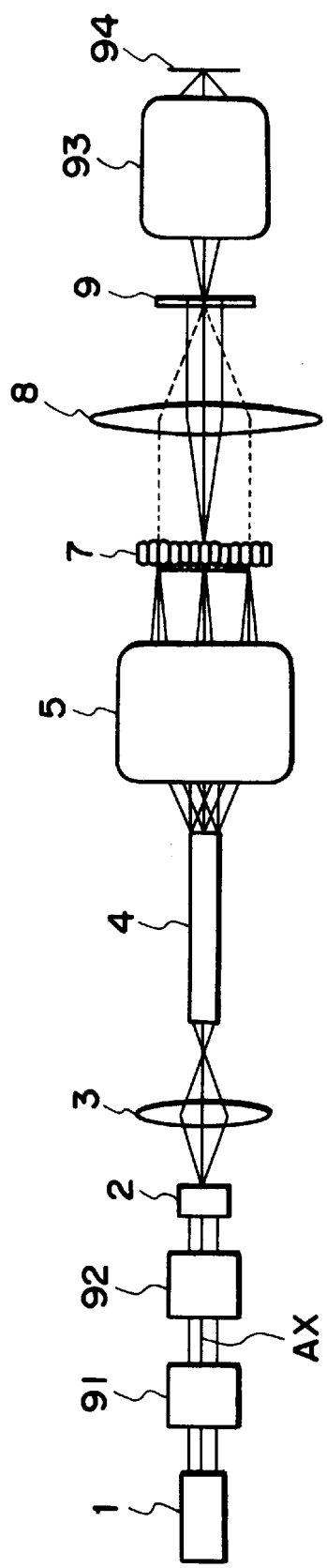
FIG. 6 is a schematic view of a first embodiment of an exposure apparatus, according to the present invention wherein the illumination system of FIG. 1 is incorporated.

FIG. 6 shows an embodiment wherein the illumination system of the above-described embodiment is incorporated into a step-and-repeat type or step-and-scan type projection exposure apparatus for the manufacture of semiconductor devices such as LSI or VLSI, CCDs, magnetic sensors or liquid crystal devices, for example.

Denoted in FIG. 6 at 91 is a beam shaping optical system for rectifying parallel light from a laser light source 1, comprising an ArF excimer laser or a KrF excimer laser, for example, into a desired beam shape. Denoted at 92 is an incoherency transformation optical system for transforming coherent laser light into incoherent light. Denoted at 93 is a projection optical system for projecting a unit-magnification image of a reduced image of a circuit pattern of a mask 9. Denoted at 94 is a wafer which comprises a substrate (silicon or glass) having a photosensitive material applied thereto. The elements corresponding to those shown in FIG. 1 are denoted by like numerals, and a duplicate explanation therefor will be omitted.

As regards the laser light from the laser light source 1, when the projection optical system 93 is one not having been chromatic-aberration corrected, the spectral half width may be band-narrowed to about 1–3 pm. When the projection optical system 93 is one having been chromatic-aberration corrected, the spectral half width may be band-narrowed to a certain value not less than 10 pm. When the projection optical system 93 is one having been chromatic-aberration corrected, in some cases, the laser light not band-narrowed may be used.

As regards the projection optical system 93, an optical system provided by lens elements only, an optical system provided by lens elements and at least one concave mirror, or an optical system provided by lens elements and at least one diffractive optical element such as a kinoform, may be used. For correction of chromatic aberration, lens elements made of glass materials having different dispersion powers (Abbe constants) may be used or, alternatively, the diffractive optical element described above may be arranged to produce dispersion in the opposite direction to the lens elements.

The laser light emitted by the laser light source 1 goes along a light directing optical system comprising a mirror or relay lens (not shown), and it impinges on the light shaping optical system 91. This shaping optical system 91 comprises plural cylindrical lenses or a beam expander, for example, and it functions to transform the lateral-longitudinal ratio in the size of a sectional shape of the laser light (perpendicular to the optical axis AX) into a desired value.

The light having its sectional shape rectified by the shaping optical system 91 enters the incoherency transformation optical system 92, for preventing interference of light upon the wafer 94 which leads to production of speckle. By this optical system 92, the light is transformed into incoherent light with which speckle is not easily produced.

The incoherency transformation optical system 92 may be one such as shown in Japanese Laid-Open Patent Application, Laid-Open No. 215930/1991, that is, an optical system including at least one returning system arranged so that: at a light dividing surface, the received light is divided into at least two light beams (e.g., P-polarized light and S-polarized light) and, after this, an optical path difference larger than the coherency length of the laser light is applied to one of the divided light beams; then, the one light beam is re-directed to be superposed with the other light beam and, thereafter, these light beams are emitted.

The incoherency transformed light from the optical system 92 enters the emission angle keeping optical element 2. Subsequently, in accordance with the procedure as having been described with reference to FIGS. 1–5, light fluxes emitted from small regions (small lenses) of the wavefront division type integrator 7 are superposed one upon another by the condensing optical system 8 to illuminate the mask 9, such that the mask 9 is uniformly illuminated with a uniform illuminance distribution produced over the whole circuit pattern of the mask 9 to be projected. Thus, the circuit pattern of the mask 9 is projected and imaged on the wafer 94 by the projection optical system 94, and the circuit pattern (image) is printed on the photosensitive material of the wafer 94. The wafer 94 is held fixed on an X-Y-Z movable stage (not shown) through vacuum attraction, for example. The X-Y-Z movable stage has a function for translation motion in upward/downward directions as well as leftward/rightward directions as viewed in the drawing, and this movement is controlled by use of distance measuring means such as a laser interferometer, not shown. Since this is well known in the art, a detailed description thereof will be omitted.

In FIG. 6, there is no aperture stop for illumination in the light path on the light exit side of the wavefront division type integrator 7. However, plural aperture stops corresponding to different σ values may be provided in a disk member (turret) which may be rotated in association with zooming of the zooming optical system and interchange of emission angle keeping optical elements such that an aperture stop of a desired σ value may be inserted into the light path on the light exit side of the wavefront division type integrator 7.

As for the shapes of such aperture stop members, ordinary circular shape openings or ring-like openings, or a combination of four openings off the optical axis as disclosed in Japanese Laid-Open Patent Application, Laid-Open No. 329623/1992, may be used.

Another embodiment of an illumination system according to the present invention will be described with reference to FIGS. 7A–8B.

FIGS. 7A–8B are schematic views, respectively, of an illumination system which is suitably usable in a step-and-scan type projection exposure apparatus for the manufacture of devices such as semiconductor chips (e.g., LSI or VLSI), CCDs, magnetic sensors and liquid crystal devices, for example.

Figure 7A:
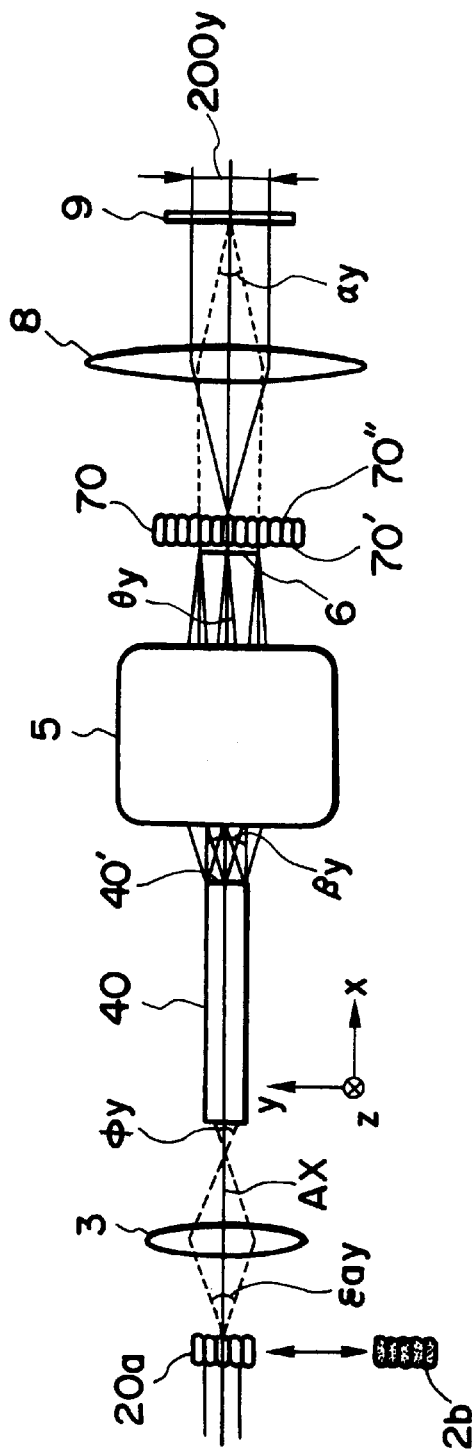
FIGS. 7A and 7B are schematic views, respectively, of a second embodiment of an illumination system according to the present invention, with the structure arranged for a small σ state.
Figure 7B:
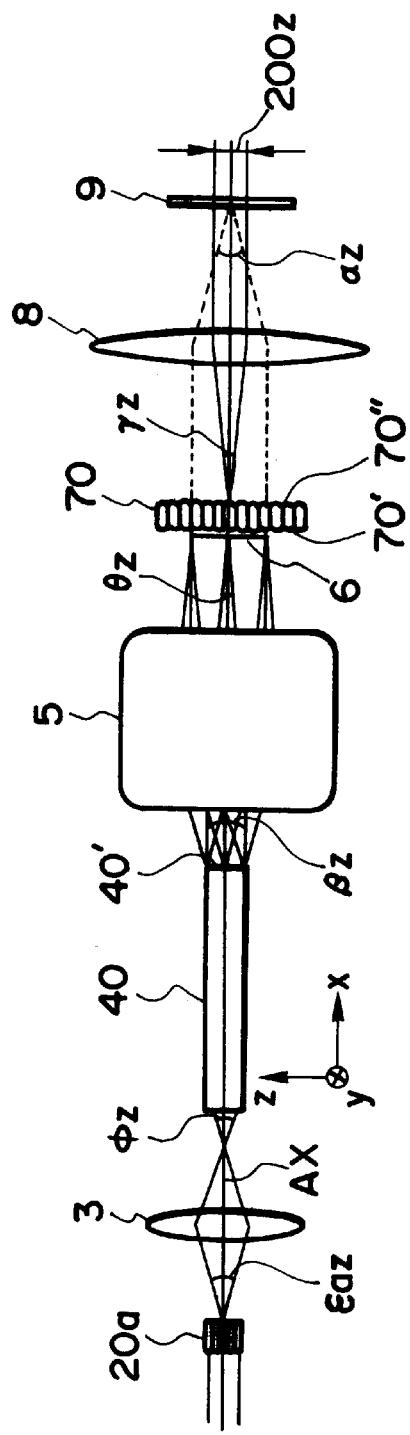

FIGS. 7A and 7B shows a case wherein the illumination system of this embodiment is in the smaller σ state as described. FIG. 7A shows the illumination system, as viewed in the scan direction (hereinafter "z direction"), and FIG. 7B shows the illumination system as viewed in a direction (hereinafter "y direction") perpendicular to the scan direction. FIGS. 8A and 8B show a case wherein the illumination system of this embodiment is in the larger σ state as described. FIG. 8A shows the illumination system in the z direction, and FIG. 8B shows the illumination system as viewed in the y direction. In FIGS. 7A–8B, the section which contains the optical axis AX and an axis extending in the y direction from the optical axis AX will be referred to as the "x-z section", and the section which contains the optical axis AX and an axis extending in the z direction from the optical axis AX will be referred to as the "x-z section".

In FIGS. 7A–8B, denoted at 20a and 20b are emission angle keeping optical elements having different open angles (emission angles) of emitted light. Denoted at 40 is an inside reflection type integrator, and denoted at 40' is the light exit surface of this inside reflection type integrator. Denoted at 70 is a wavefront division type integrator, and denoted at 70' and 70" are light entrance surfaces of this wavefront division type integrator. Denoted at 200y is the length of an illumination region on the mask, in the y direction. Denoted at 200z is the length of the illumination region of the mask, in the z direction. The elements of this embodiment corresponding to those shown in FIGS. 1–6 are denoted by like numerals as those of FIG. 3.

The basic structure and function of the illumination system of this embodiment shown in FIGS. 7A–8B are essentially the same as those of the illumination system of the preceding embodiment shown in FIGS. 1–6. The illumination system of this embodiment differs from that of the preceding embodiment of FIGS. 1–6, in the structure and function of the emission angle keeping optical system, inside reflection type integrator and wavefront division type integrator. Thus, only the difference of this embodiment over the preceding embodiment will be explained below.

In step-and-scan type projection exposure apparatus, an illumination region of a rectangular slit-like shape, extending in the y direction (length is larger in the y direction than in the z direction) should be effectively defined on the mask 9.

In consideration of this, in this embodiment, as regards the emission angle keeping optical elements, those elements 20a and 20b each comprising a fly's eye lens with small lenses having a rectangular shape, in section (y-z section) perpendicular to the optical axis, being elongated in the y direction, are used. As regards the inside reflection type integrator, the integrator 40 comprising a rectangular prism optical pipe having a shape, in section (y-z section) perpendicular to the optical axis, which shape is represented by a pair of straight lines extending in the y direction as well as a pair of straight lines extending in the z direction, is used. Further, as regards the wavefront division type integrator, the integrator 70 comprising a fly's eye lens with small lenses having a rectangular shape, in y-z section, being elongated in the y direction, is used.

The small lenses constituting the emission angle keeping optical elements 20a and 20b each has a numerical aperture in the x-y section which is larger than the numerical aperture in the x-z section. Thus, as regards the relation of the open angle (emission angle) of light between these sections, the emission angles $\epsilon ay$ and $\epsilon by$ in the x-y section are larger than the emission angles $\epsilon az$ and $\epsilon bz$ in the x-z section. Therefore, with regard to the open angles (emission angles or incidence angles) $\phi y$, $\phi z$, $\beta y$, $\beta z$, $\theta y$, $\theta z$, $\gamma y$, $\gamma z$, $\alpha y$, and $\alpha z$ of light as illustrated, there are relations $\phi y > \phi z$, $\beta y > \beta z$, $\theta y > \theta z$, $\gamma y > \gamma z$, and $\alpha y > \alpha z$. Here, since $\gamma y > \gamma z$, on the mask 9, an illumination region of a rectangular slit-like shape elongated in the y direction is produced.

Further, similar to the preceding embodiment, in dependence upon the magnitude of $\sigma$, there are relations $\epsilon ay < \epsilon by$ and $\epsilon az < \epsilon bz$. Also, in dependence upon the property of the optical pipe of a prism-like shape, there are relations $\phi y = \beta y$ and $\phi z = \beta z$.

As regards the emission angle keeping optical elements 20a and 20b, a fly's eye lens with small lenses having a focal length in x-y section smaller than the focal length in x-z section and being arrayed two-dimensionally along the y-z section, may be used. Further, as regards the stop 21 shown in FIG. 2A, an element having a slit opening extending in the y direction, may be used. It is to be noted that the small lenses constituting the fly's eye lens may be provided by ordinary lenses or a diffractive optical element (e.g., a Fresnel lens).

Figure 9:
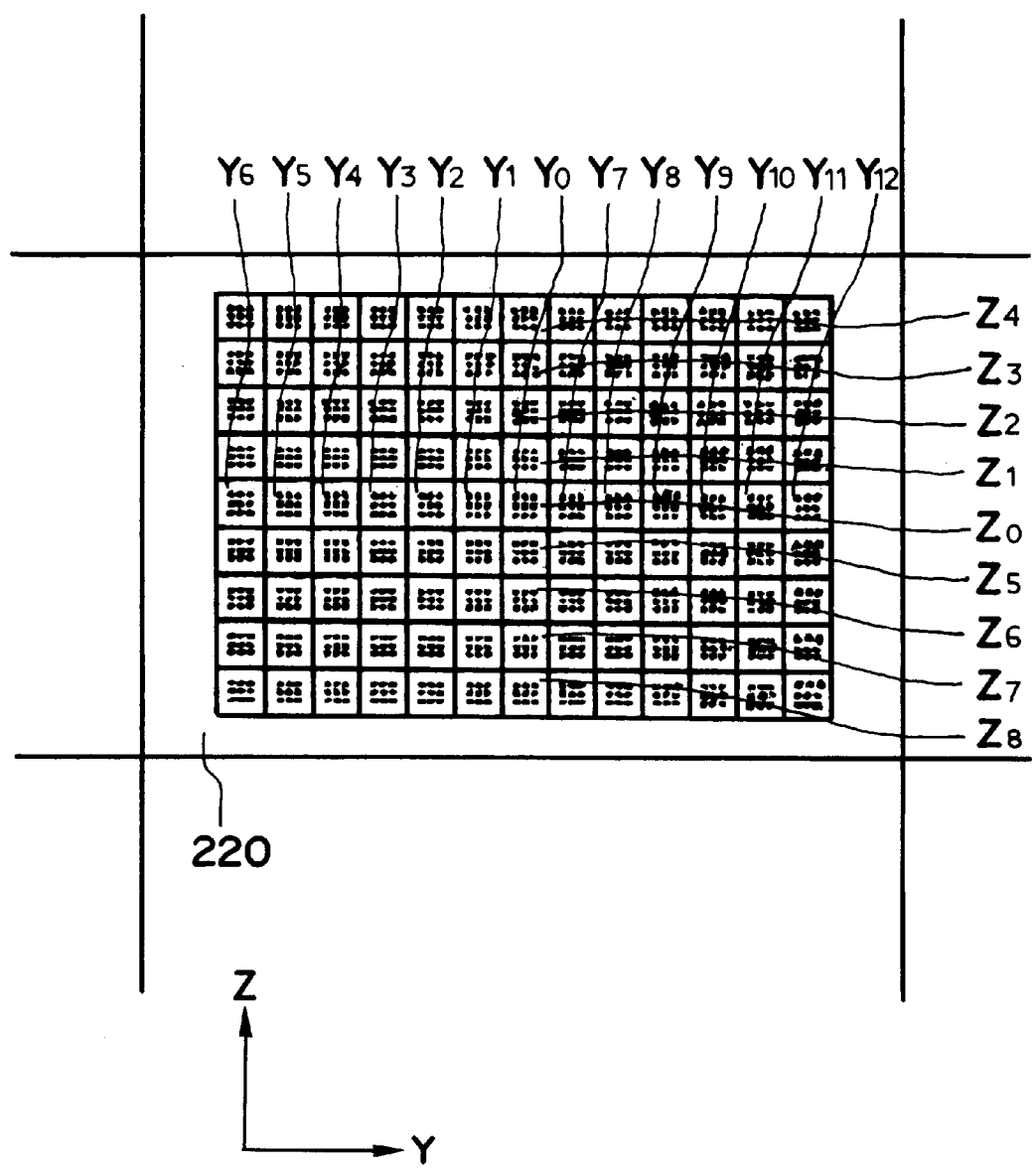
FIG. 9 is a schematic view for explaining virtual image groups as defined by the inside reflection type integrator used in FIGS. 7A–8B.

FIG. 9 illustrates an array of virtual image groups (seeming light source image groups) produced by the inside reflection type integrator 40, as viewed from the light exit surface from a single small lens of the wavefront division type integrator 70. In FIG. 9, denoted at 220 is a small lens of the wavefront division type integrator 70, and denoted at Y1–Y12 and Z1–Z12 are virtual images.

As seen from FIG. 9, since the inside reflection type integrator 40 comprises an optical pile of a rectangular prism shape, the virtual image groups are arrayed in a grid, along the y direction and z direction. Since the incidence angle of divergent light, impinging on the inside reflection type integrator 40, differs between the x-y section and the x-z section, the number of times of reflection at the inside reflection surface differs between the x-y section and the x-z section. As a result, the number of virtual images differs between the y direction and the z direction. It is to be noted that these virtual images are images of convergence points (point light sources) of laser light as formed between the condensing optical system 3 and the inside reflection type integrator 40.

In the illumination system of this embodiment, each of the emission angle keeping optical elements 20a and 20b shown in FIGS. 7A–8B comprises a fly's eye lens having small lenses of a number "m×n" (m≧2 and n≧2). Thus, an individual virtual image in the virtual image groups is provided by plural images, being divided into a number about "m×n". Therefore, virtual images as provided by a grid array of these divided images are seen, and they correspond to a single small lens of the wavefront division type integrator 70.

Thus, also in the illumination system of this embodiment, when the light fluxes from the plural point light sources (effective light sources) as formed at or adjacent to the light exit surface 70" of the wavefront division type integrator 70 are superposed one upon another by the condensing optical system 8 to illuminate the object 9, the number of such point light sources (effective light sources) is made quite large. This enables, for illumination of the object 9, the provision of a more uniform illuminance distribution over the whole object 9.

As in the preceding embodiment, in the illumination system of this embodiment, when the smaller $\sigma$ state or larger $\sigma$ state is to be established in accordance with the type of the mask 9 used, the imaging magnification of the zooming optical system 5 is switched between a larger value and a smaller value and, additionally, the emission angle keeping optical elements 20a and 20b are interchanged. This enables changing the values of angles $\alpha y$ and $\alpha z$ (=$\alpha y$) while the values of angles $\theta y$ and $\theta z$ are maintained constant or substantially constant. Thus, the value $\sigma$ can be changed without loss of light utilization efficiency. Further, even if the laser light from the laser light source shifts, non-uniformness of illuminance is not produced on the mask 9 surface.

Figure 10:
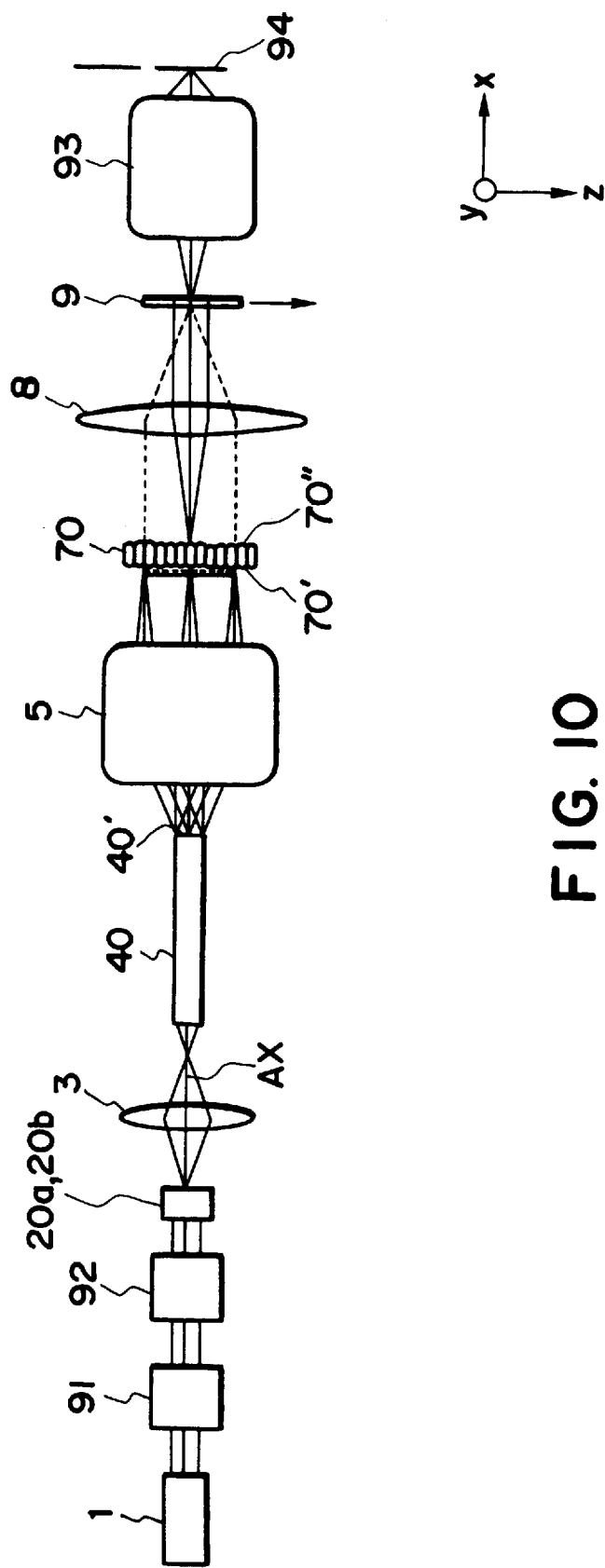
FIG. 10 is a schematic view of a second embodiment of an exposure apparatus according to the present invention, wherein the illumination system shown in FIGS. 7A–8B is incorporated.

FIG. 10 shows an embodiment wherein the illumination system shown in FIGS. 7A–9 is incorporated into a step-and-scan type projection exposure apparatus, for example, for manufacture of semiconductor devices such as LSI or VLSI, CCDs, magnetic sensors or liquid crystal devices, for example.

Denoted in FIG. 10 at 91 is a beam shaping optical system for rectifying parallel light from a laser light source 1, comprising an ArF excimer laser or a KrF excimer laser, for example, into a desired beam shape. Denoted at 92 is an incoherency transformation optical system for transforming coherent laser light into incoherent light. Denoted at 93 is a projection optical system for projecting a unit-magnification image of a reduced image of a circuit pattern of a mask 9. Denoted at 94 is a wafer which comprises a substrate (silicon or glass) having a photosensitive material applied thereto. The elements corresponding to those shown in FIGS. 7–9 are denoted by like numerals, and a duplicate explanation therefor will be omitted.

The laser light emitted by the laser light source 1 goes along a light directing optical system comprising a mirror or relay lens (not shown), and it impinges on the light shaping optical system 91. This shaping optical system 91 comprises plural cylindrical lenses or a beam expander, for example, and it functions to transform the lateral-longitudinal ratio in the size of a sectional shape of the laser light (perpendicular to the optical axis AX) into a desired value.

The light having its sectional shape rectified by the shaping optical system 91 enters the incoherency transformation optical system 92, for preventing interference of light upon the wafer 94 which leads to production of speckle. By this optical system 92, the light is transformed into incoherent light with which speckle is not easily produced.

The incoherency transformation optical system 92 may be one such as shown in Japanese Laid-Open Patent Application, Laid-Open No. 215930/1991, having been described hereinbefore.

The incoherency transformed light from the optical system 92 enters the emission angle keeping optical element 20a or 20b. Subsequently, in accordance with the procedure as having been described with reference to the first embodiment in relation to FIGS. 1–5, light fluxes emitted from small regions (small lenses) of the wavefront division type integrator 70 are superposed one upon another by the condensing optical system 8 to illuminate the mask 9, such that the mask 9 is uniformly illuminated with a uniform illuminance distribution produced over the whole circuit pattern of the mask 9 to be projected. Here, an illumination region (light) of a rectangular slit-like shape is formed on the mask 9. Then, the circuit pattern of the mask 9 is projected and imaged on the wafer 94 by the projection optical system 93, and the circuit pattern (image) is printed on the photosensitive material of the wafer 94.

The wafer 94 is held fixed on an X-Y-Z movable stage (not shown), being movable in x, y and z directions, through vacuum attraction, for example. Also, the mask 9 is held fixed on another x-y-z movable stage (not shown), being movable in the x, y and z directions, through vacuum attraction, for example. The motion of these stages is controlled by the use of distance measuring means such as a laser interferometer, not shown. These x-y-z stages are moved with a rectangular slit-like illumination region defined at an end portion of the circuit pattern of the mark 9, so that the mask 9 is scanned in the z direction while the wafer 94 is scanned in the −z direction. By this, the whole circuit pattern of the mask 9 is projected on the wafer 94, and the whole circuit pattern is transferred and printed on the wafer 94. It is to be noted that, when the projection optical system 93 has a projection magnification M and the scan speed of the mask 9 is V, the scan speed of the wafer 94 should be "−M×V".

Figure 11:
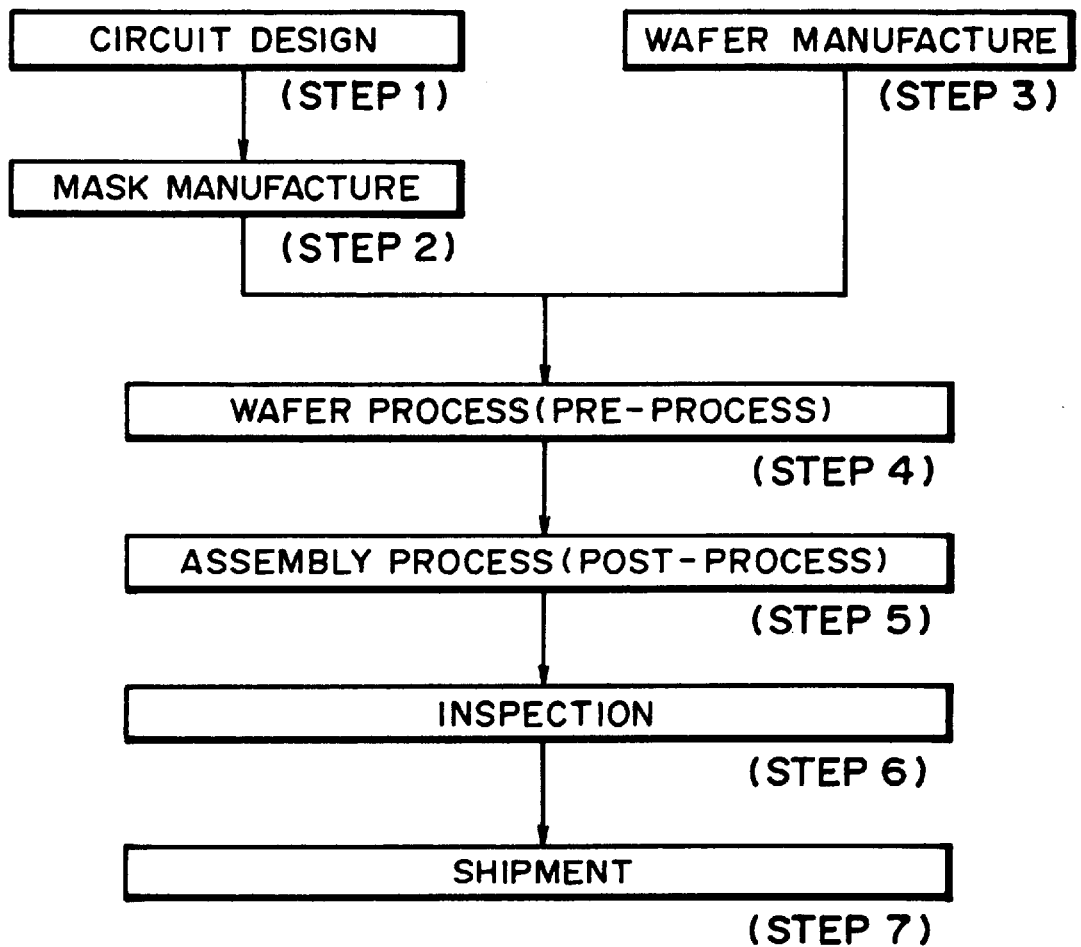
FIG. 11 is a flow chart of device manufacturing processes, wherein the exposure apparatuses of the first and second embodiments of the present invention are applicable to the wafer process.

FIG. 11 is a flow chart for explaining the processes for the manufacture of devices such as LSI or VLSI (semiconductor chips), for example, by use of one of the exposure apparatuses as described hereinbefore. The exposure apparatus according to any one of the preceding embodiments is used for the "wafer process" at step 4.

Figure 12:
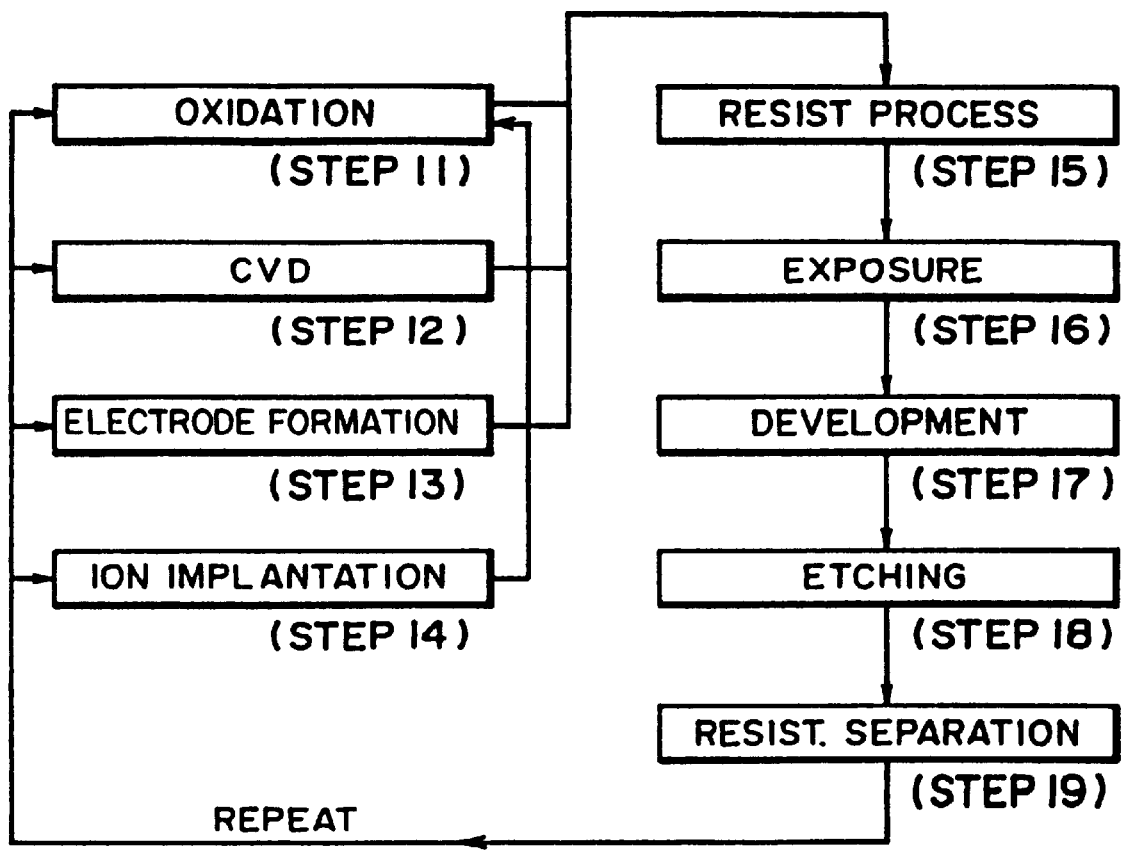
FIG. 12 is a flow chart for explaining details of the wafer process, wherein the exposure apparatuses of the first and second embodiments of the present invention are applicable to the exposure step.
Figure 13:
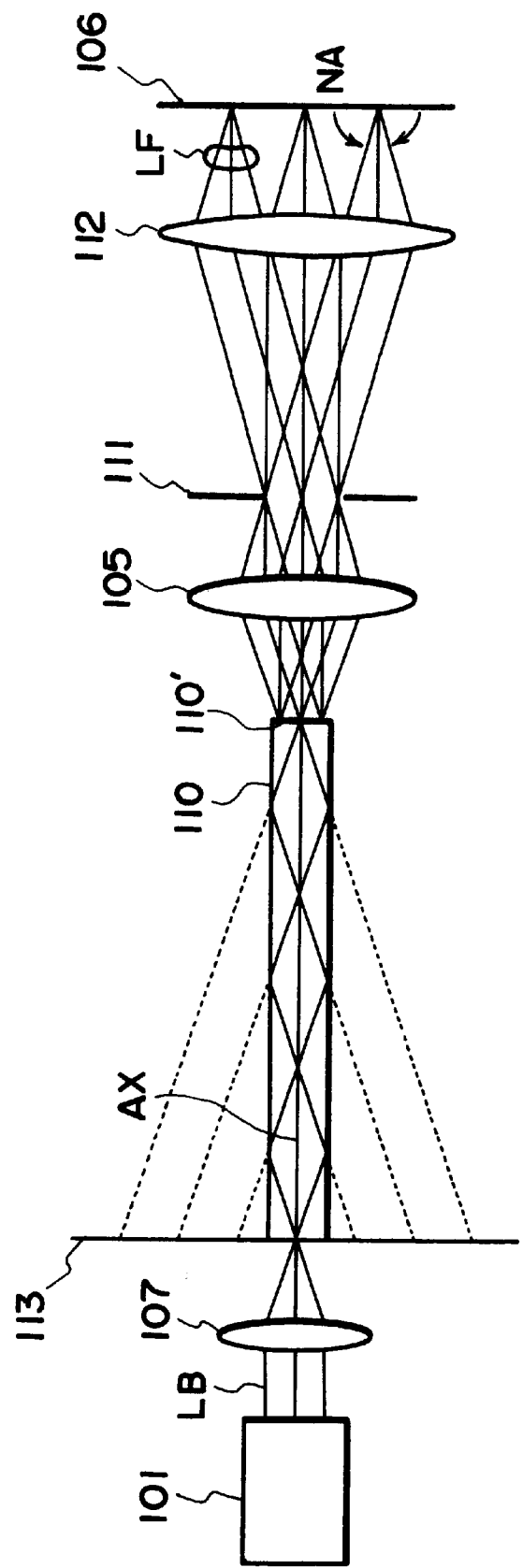
FIG. 13 is a schematic view of a known type of an illumination system.

FIG. 12 is a flow chart for explaining details of the wafer process of FIG. 11. The exposure apparatus according to any one of the preceding embodiments is used in the "exposure" process at step 16.

In accordance with any one of the embodiments of the present invention as described above, there is provided an illumination system with an inside reflection type integrator and a wavefront division type integrator, by which the state of illumination can be changed.

Also, in accordance with any one of the embodiments of the present invention as described above, there is provided an illumination system with a wavefront division type integrator, by which substantially no decrease occurs in the quantity of light, irradiating an object such as a mask or reticle, even if the state of illumination is changed.

Further, in accordance with any one of the embodiments of the present invention as described above, there is provided an illumination system with an inside reflection type integrator and a wavefront division type integrator, by which no change occurs in the illuminance distribution on the surface of an object such as a mask or reticle, even if the path of laser light from a laser light source shifts.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:
a first optical integrator of inside reflection type, for reflecting at least a portion of received light, with its inside surface, and for defining a surface light source at or adjacent a light exit surface thereof;
a second optical integrator of wavefront division type, for dividing the wavefront of received light and for defining a plurality of light sources at or adjacent a light exit surface thereof;
an imaging optical system for imaging the surface light source at or adjacent a light entrance surface of said second optical integrator; and
a collecting optical system for superposing light rays from said plurality of light sources one upon another, on a surface to be illuminated;
wherein said imaging optical system has a variable imaging magnification.

2. A system according to claim 1, wherein said imaging optical system includes a plurality of optical elements, and wherein the imaging magnification of said imaging optical system is changeable with shift of said optical elements.

3. A system according to claim 1, wherein said imaging optical system includes a plurality of optical systems having different imaging magnifications, and wherein said optical systems are selectively interposed between said first and second optical integrators to selectively provide different imaging magnifications.

4. A system according to claim 1, further comprising an optical device for introducing light from a light source into said first optical integrator, said optical device including an optical member which is serviceable to maintain a divergence angle or convergence angle of light to be emitted from said optical member, substantially constant, regardless of a shift of the position of incidence of light from said light source in a direction perpendicular to an optical axis.

5. A system according to claim 4, wherein said optical member includes a third optical integrator of wavefront division type, for dividing the wavefront of received light and for defining a plurality of light sources at or adjacent a light exit surface thereof.

6. A system according to claim 4, wherein said optical member comprises a lens and a stop with an opening smaller than the diameter of said lens.

7. A system according to claim 4, wherein said optical device includes a plurality of optical members each as aforesaid, wherein said optical members are arranged so as to emit lights of different divergence angles or convergence angles, and wherein, with replacement of one optical member disposed on the light path by another in response to the change of imaging magnification, the numerical aperture of light impinging on said second optical integrator is maintained substantially constant regardless of the change in imaging magnification.

8. A system according to claim 4, wherein said optical member includes a plurality of optical elements which are shiftable to change a focal length thereof, and wherein, with a change in focal length of said optical member in response to the change in imaging magnification, the numerical aperture of light impinging on said second optical integrator is maintained substantially constant regardless of the change in imaging magnification.

9. A system according to claim 4, wherein said optical member serves to emit lights having different divergence angles or convergence angles with respect to two orthogonal sectional planes.

10. An illumination system, comprising:
a wavefront division type optical integrator for dividing the wavefront of received light and for defining a plurality of light sources at or adjacent a light exit surface thereof;
a light projecting optical system of variable focal length, for projecting light from a light source to a light entrance surface of said wavefront division type optical integrator, wherein a change in focal length of said light projecting optical system causes a change of at least one of the size and the intensity distribution of the light, from the light source, upon the light entrance surface of said wavefront division type optical integrator;

a collecting optical system for superposing light rays from said plurality of light sources one upon another, on a surface to be illuminated;

wherein said light projection optical system serves to correct a numerical aperture of light, impinging on said wavefront division type optical integrator, as changed by the change in focal length.

11. A system according to claim 10, wherein said light projecting optical system includes an inside reflection type optical integrator for reflecting at least a portion of received light, at an inside surface thereof, and for defining a surface light source at or adjacent a light exit surface thereof, and an imaging optical system of variable focal length for imaging said surface light source at or adjacent the light entrance surface of said wavefront division type optical integrator, and wherein a change in focal length of said imaging optical system causes a change of imaging magnification of said imaging optical system.

12. A system according to claim 11, wherein said imaging optical system includes a plurality of optical elements, and wherein the imaging magnification of said imaging optical system is changeable with shift of said optical elements.

13. A system according to claim 11, wherein said imaging optical system includes a plurality of optical systems having different imaging magnifications, and wherein said optical systems are selectively interposed between said wavefront division type optical integrator and said inside reflection type optical integrator to selectively provide different imaging magnifications.

14. A system according to claim 11, wherein said light projecting optical system includes an optical member of variable focal length, which is disposed between the light source and said inside reflection type optical integrator, and wherein a change of focal length of said optical member in accordance with a change in focal length of said imaging optical system is effective to correct a change in numerical aperture of light impinging on the light entrance surface of said wavefront division type optical integrator.

15. A system according to claim 14, wherein said optical member includes a plurality of optical elements for emitting lights with different divergence angles or convergence angles, wherein one of said optical elements is disposed along a light path between the light source and said inside reflection type optical integrator, and wherein, with replacement of one optical element disposed on the light path by another in response to the change of focal length of said imaging optical system, a change in numerical aperture of light impinging on said wavefront division type optical integrator is corrected.

16. A system according to claim 15, wherein said optical member includes a plurality of wavef ront division type optical integrators for diving a wavefront of received light and for defining a plurality of light sources at or adjacent a light exit surface thereof.

17. A system according to claim 14, wherein said optical member includes a plurality of optical elements which are shiftable to change a focal length thereof, and wherein, with a change in focal length of said optical member in response to the change in focal length of said imaging optical system, a change in numerical aperture of light impinging on said wavefront division type optical integrator is corrected.

18. A system according to claim 14, wherein said optical member serves to emit lights having different divergence angles or convergence angles with respect to two orthogonal sectional planes.

19. An illumination system, comprising:

a first optical integrator of wavefront division type, for dividing the wavefront of received light and for defining a plurality of light sources at or adjacent a light exit surface thereof;

a second optical integrator of inside reflection type, for reflecting at least a portion of received light, with its inside surface, and for defining a surface light source of uniform intensity distribution, at or adjacent a light exit surface thereof;

a third optical integrator of wavefront division type, for dividing the wavefront of received light and for defining a plurality of light sources at or adjacent a light exit surface thereof;

a first imaging optical system for imaging the light sources as defined by said first optical integrator, on or adjacent a light entrance surface of said second optical integrator;

a second imaging optical system for imaging the surface light source as defined by said second optical integrator, on or adjacent a light entrance surface of said third optical integrator; and a collecting optical system for superposing light rays from the light sources as defined by said third optical integrator, one upon another on a surface to be illuminated.

20. A system according to claim 19, wherein said first optical integrator serves to emit lights having different divergence angles or convergence angles with respect to two orthogonal sectional planes.

21. An exposure apparatus for transferring a pattern of a mask onto a wafer by exposure, said apparatus comprising:

an illumination system as recited in any one of claims 1–20, for illuminating the mask; and a projection optical system for projecting a pattern of the mask illuminated, on to the wafer whereby the pattern of the mask is transferred to the wafer.

22. A device manufacturing method, comprising the steps of:

applying a resist to a wafer;

transferring, by exposure, a pattern of a mask on to the wafer by use of an exposure apparatus as recited in claim 21; and developing the exposed wafer.

* * * * *

UNITED STATES PATENT AND TRADEMARK OFFICE
CERTIFICATE OF CORRECTION

PATENT NO.    : 6,285,855 B1
DATED         : September 4, 2001
INVENTOR(S)   : Toshihiko Tsuji It is certified that error appears in the above-identified patent and that said Letters Patent is hereby corrected as shown below:

Title page,
Under "*Assistant Examiner*": "Michael A Lucas" should read -- Michael A. Lucas --.

Column 2,
Line 4, "reticle, not shown." should read -- reticle (not shown). --.

Column 5,
Line 24, "the the" should read -- to the --.

Column 6,
Line 19, "Virtual" should read -- virtual --.

Column 10,
Line 25, "whole" should be deleted.

Column 11,
Line 53, "interferometer, not shown" should read -- interferometer (not shown) --.

Column 12,
Line 13, "shows" should read -- show --.

Column 15,
Line 17, "interferometer, not shown." should read -- interferometer (not shown). --.

UNITED STATES PATENT AND TRADEMARK OFFICE
CERTIFICATE OF CORRECTION

PATENT NO. : 6,285,855 B1
DATED : September 4, 2001
INVENTOR(S) : Toshihiko Tsuji It is certified that error appears in the above-identified patent and that said Letters Patent is hereby corrected as shown below:

<u>Column 17,</u>
Line 57, "wavef ront" should read -- wavefront --.
Line 58, "diving" should read -- dividing --.

Signed and Sealed this

Ninth Day of April, 2002

Attest:

JAMES E. ROGAN
*Attesting Officer*     *Director of the United States Patent and Trademark Office*